US010909430B2

(12) United States Patent
Zhao

(10) Patent No.: US 10,909,430 B2
(45) Date of Patent: Feb. 2, 2021

(54) CARD TRAY OF ELECTRICAL CONNECTOR ASSEMBLY HAVING A FRONT SURFACE FEATURE FOR INCREASING A WITHDRAWN TRAVEL DISTANCE

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Jun Zhao, Huaian (CN)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/553,195

(22) Filed: Aug. 28, 2019

(65) Prior Publication Data
US 2020/0074248 A1    Mar. 5, 2020

(30) Foreign Application Priority Data

Aug. 30, 2018    (CN) .......................... 2018 1 1001986

(51) Int. Cl.
*G06K 13/08*    (2006.01)
*G06K 7/00*    (2006.01)
(Continued)

(52) U.S. Cl.
CPC ....... *G06K 13/0818* (2013.01); *G06K 7/0056* (2013.01); *G06K 13/0831* (2013.01);
(Continued)

(58) Field of Classification Search
CPC ............... G06K 13/0831; G06K 13/08; G06K 13/0806; G06K 13/0825; G06K 13/0812;
(Continued)

(56) References Cited

U.S. PATENT DOCUMENTS

2012/0220146 A1    8/2012 Yokoyama et al.
2015/0056851 A1*   2/2015 Zhang .................... G06K 13/14
                                                          439/527

(Continued)

FOREIGN PATENT DOCUMENTS

TW            I600230 B    9/2017

*Primary Examiner* — Abdullah A Riyami
*Assistant Examiner* — Justin M Kratt
(74) *Attorney, Agent, or Firm* — Wei Te Chung; Ming Chieh Chang

(57) ABSTRACT

A card connector assembly includes: an electrical connector including an insulative housing, a plurality of terminals secured to the insulative housing, a shell covering the insulative housing to form a receiving cavity, and an ejector having a pivot; and a card tray removably received in the receiving cavity, the card tray having a front surface, wherein the card tray has a protrusion at the front surface, and the pivot has an engaging portion for ejecting the card tray, the engaging portion having a recess for receiving the protrusion and an ejecting end for riding onto the protrusion.

7 Claims, 7 Drawing Sheets

(51) Int. Cl.
  *H01R 13/629* (2006.01)
  *H01R 13/24* (2006.01)
  *H05K 5/02* (2006.01)

(52) U.S. Cl.
  CPC ......... *G06K 13/08* (2013.01); *G06K 13/0806* (2013.01); *G06K 13/0812* (2013.01); *G06K 13/0825* (2013.01); *H01R 13/2442* (2013.01); *H01R 13/62938* (2013.01); *H05K 5/0295* (2013.01)

(58) Field of Classification Search
  CPC .............. H01R 13/635; H01R 13/2442; H01R 13/62938; H05K 5/0295
  USPC .......................... 439/159, 160, 377, 945, 946
  See application file for complete search history.

(56)  References Cited

U.S. PATENT DOCUMENTS

2015/0188257 A1* 7/2015 Lin .................... G06K 13/0831
   439/159
  2017/0207591 A1* 7/2017 Chen .................. H01R 13/6581

* cited by examiner

CARD TRAY OF ELECTRICAL CONNECTOR ASSEMBLY HAVING A FRONT SURFACE FEATURE FOR INCREASING A WITHDRAWN TRAVEL DISTANCE

BACKGROUND OF THE INVENTION

1. Field of the Invention

The present invention relates to an electrical connector assembly having a card tray with an integral feature for achieving a relatively long travel distance during ejecting the card tray for ease of subsequent withdrawal.

2. Description of Related Arts

Taiwan Patent No. 600230 discloses a card connector assembly comprising: an electrical connector including an insulative housing, a plurality of terminals secured to the insulative housing, a shell covering the insulative housing to form a receiving cavity, and an ejector having a pivot; and a card tray removably received in the receiving cavity. The card tray has a flat front surface and the pivot has an engaging portion for ejecting the card tray. A travel distance of the card tray during its withdrawal by such ejector is limited. It is desired to increase a travel distance when ejecting a card tray without changing a general length of its pivot engaging portion.

SUMMARY OF THE INVENTION

A card connector assembly comprises: an electrical connector including an insulative housing, a plurality of terminals secured to the insulative housing, a shell covering the insulative housing to form a receiving cavity, and an ejector having a pivot; and a card tray removably received in the receiving cavity, the card tray having a front surface, wherein the card tray has a protrusion at the front surface, and the pivot has an engaging portion for ejecting the card tray, the engaging portion having a recess for receiving the protrusion and an ejecting end for riding onto the protrusion.

DETAILED DESCRIPTION OF THE PREFERRED EMBODIMENT

Figure 1:
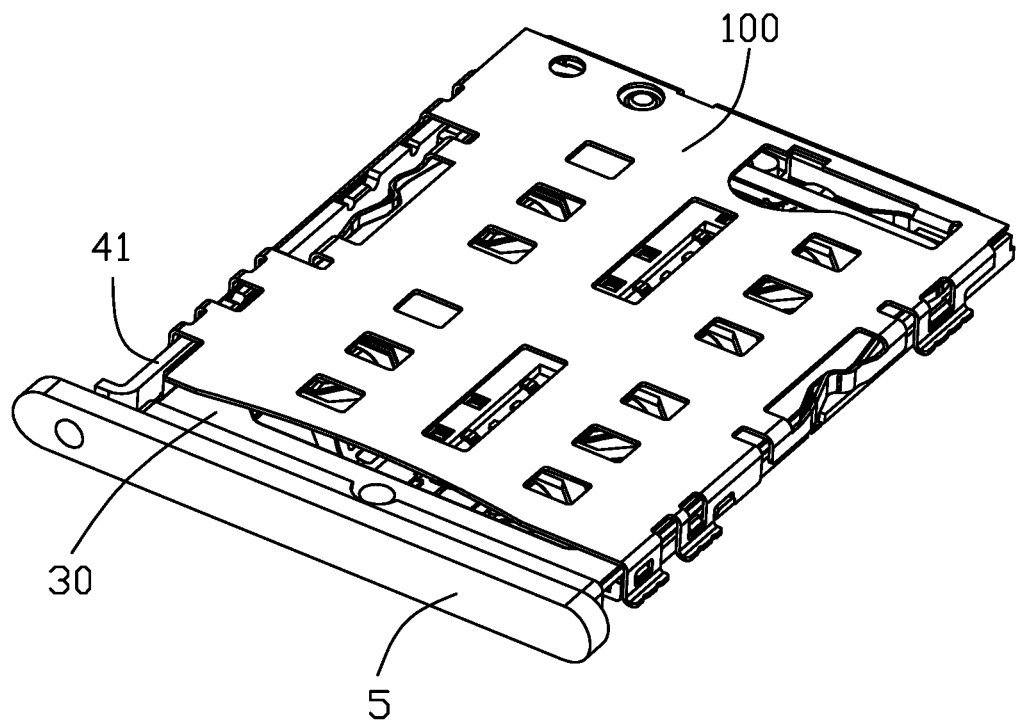
FIG. 1 is a perspective view of a card connector assembly in accordance with a first embodiment of the present invention.
Figure 2:
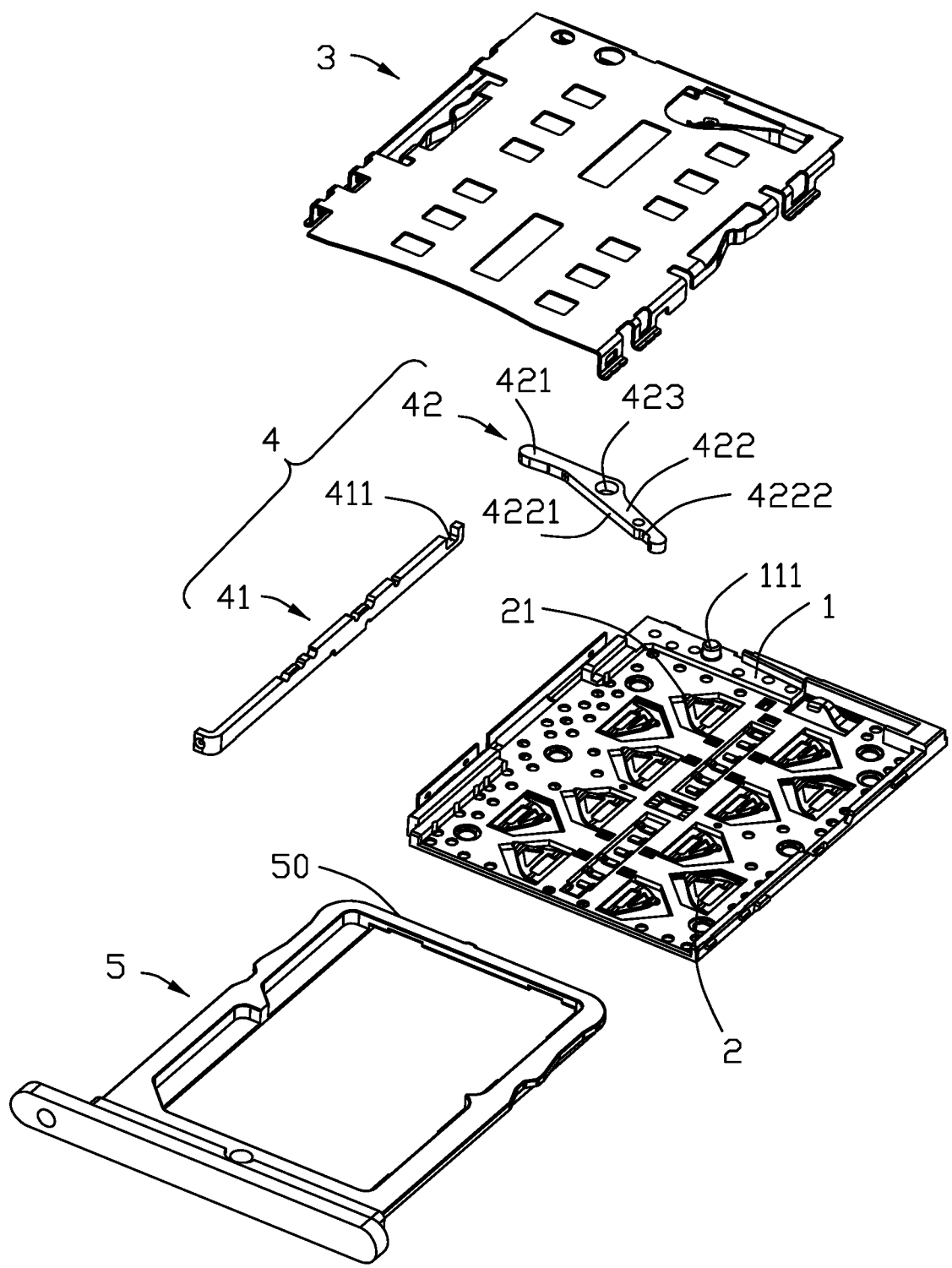
FIG. 2 is an exploded view of the card connector assembly.
Figure 3:
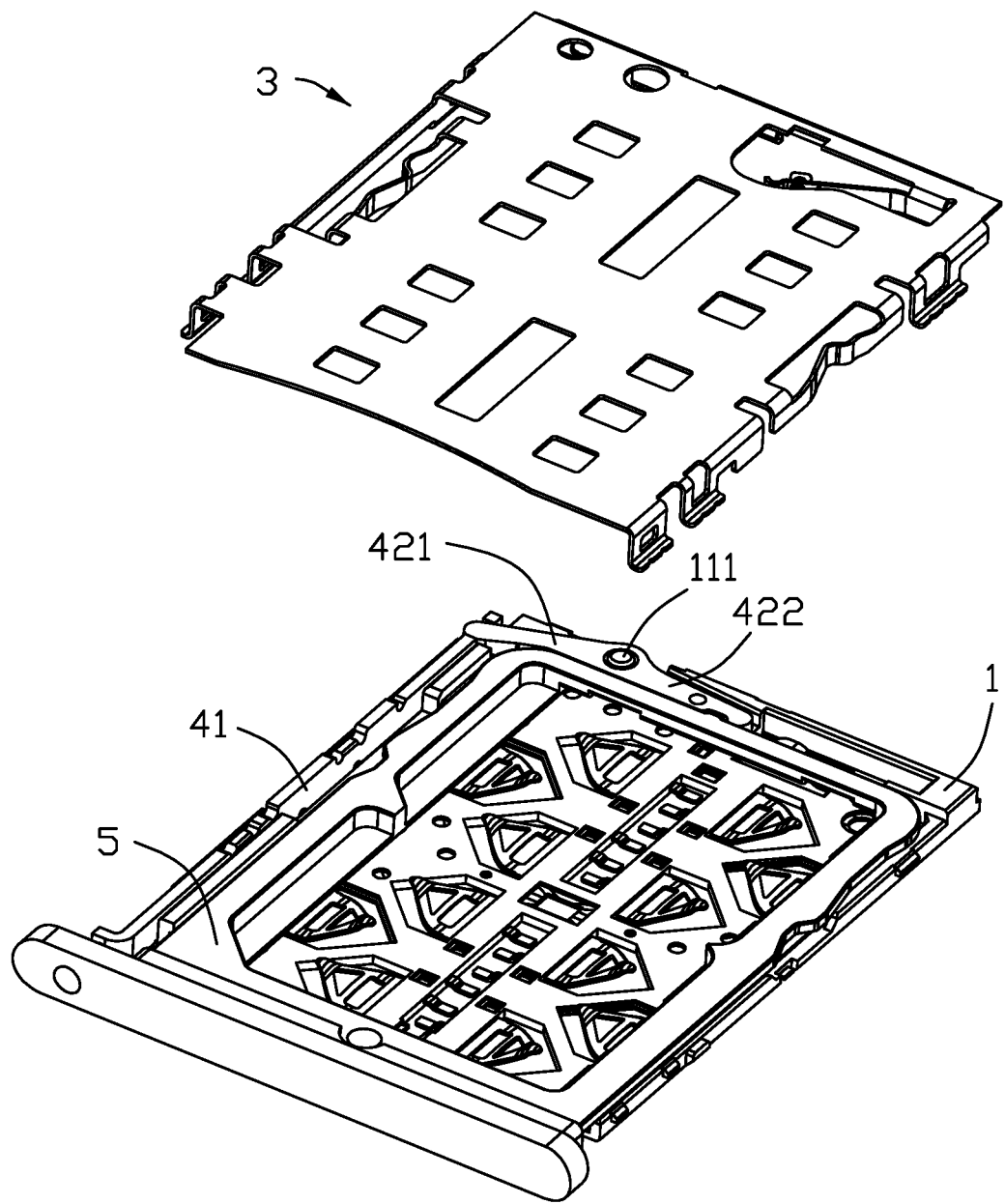
FIG. 3 is partially assembled view of the card connector assembly in FIG. 2.
Figure 4:
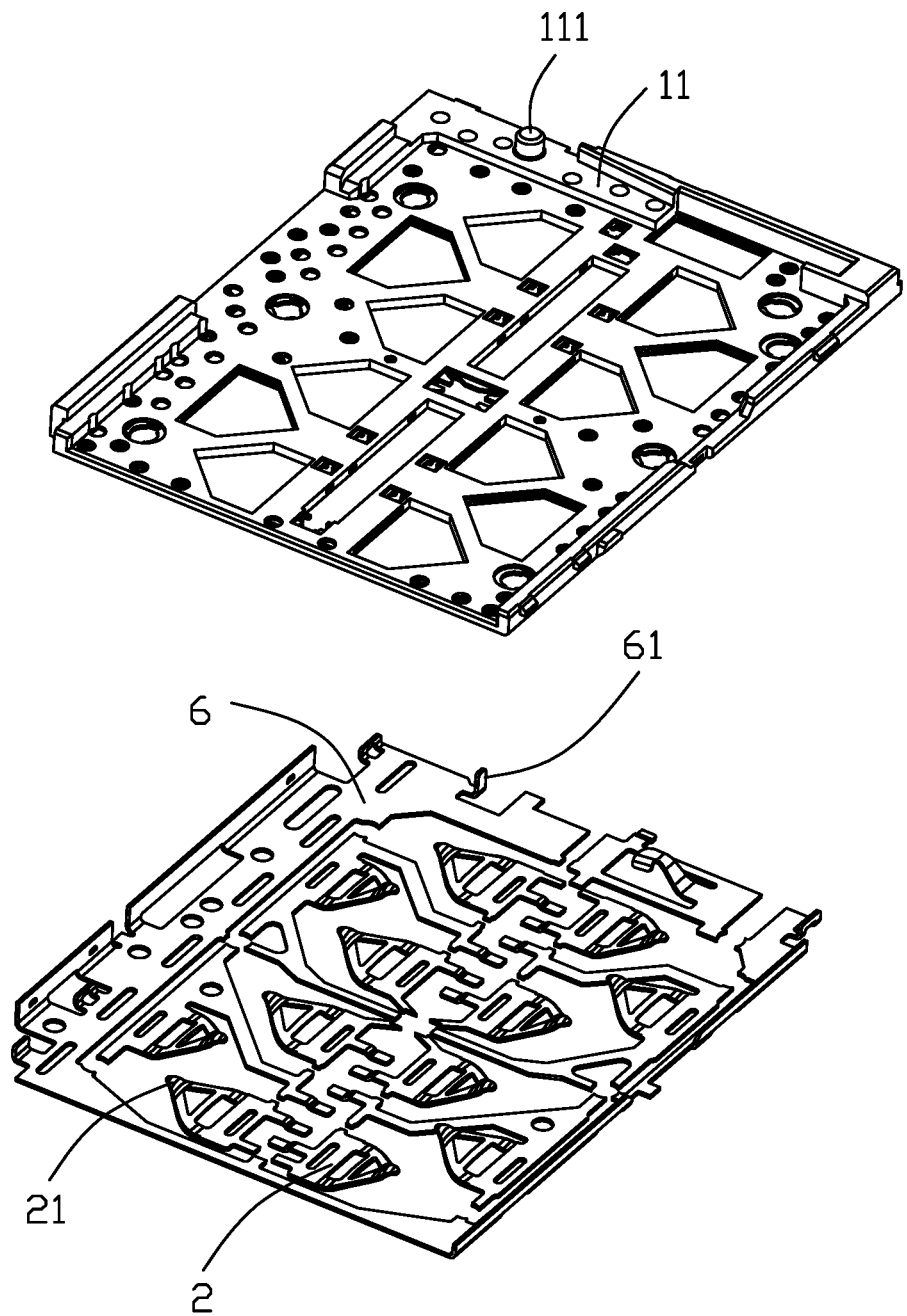
FIG. 4 is an exploded view of an electrical connector of the card connector assembly.
Figure 5:
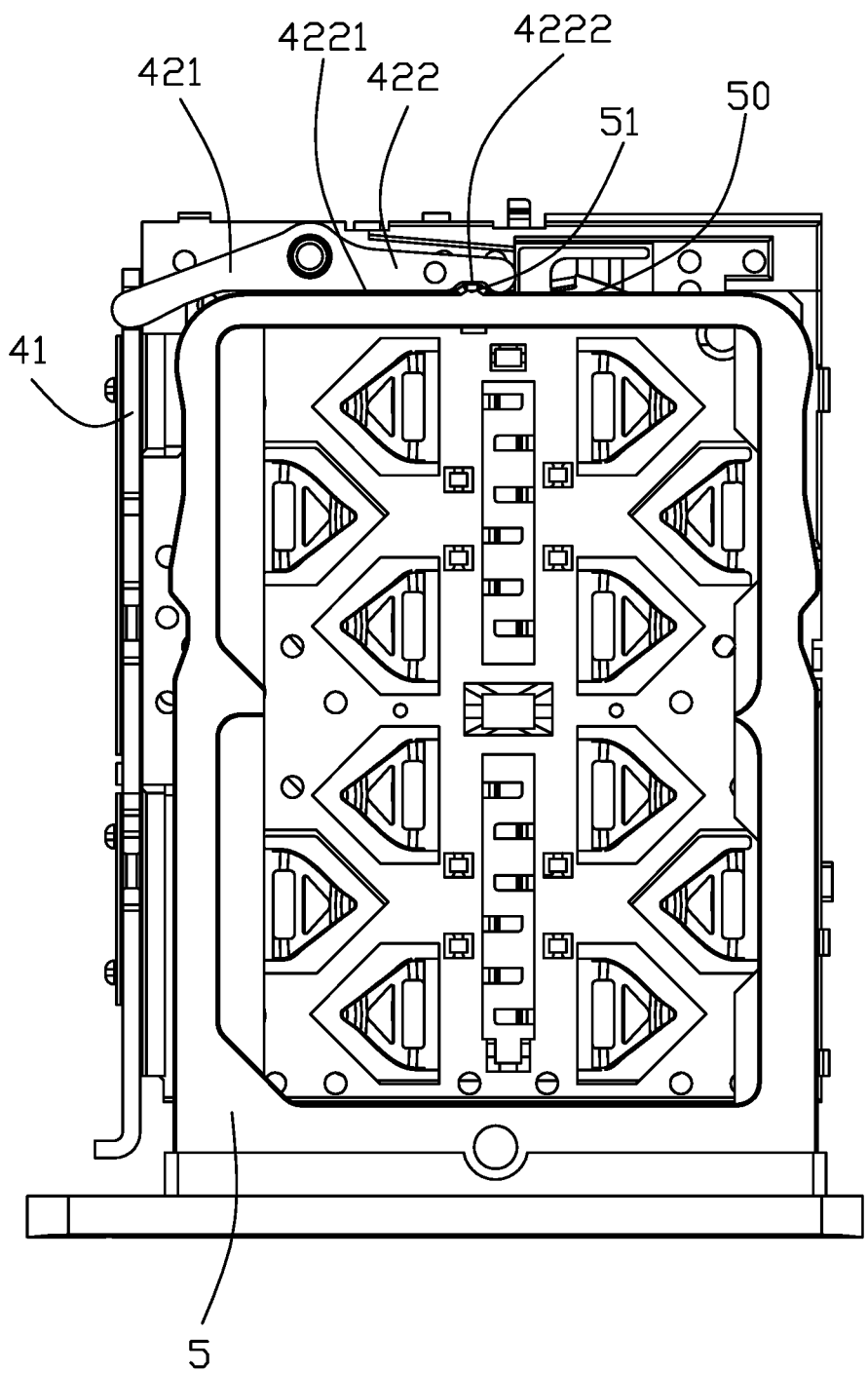
FIG. 5 is a plan view showing a card tray of the card connector assembly at an inserted position.
Figure 6:
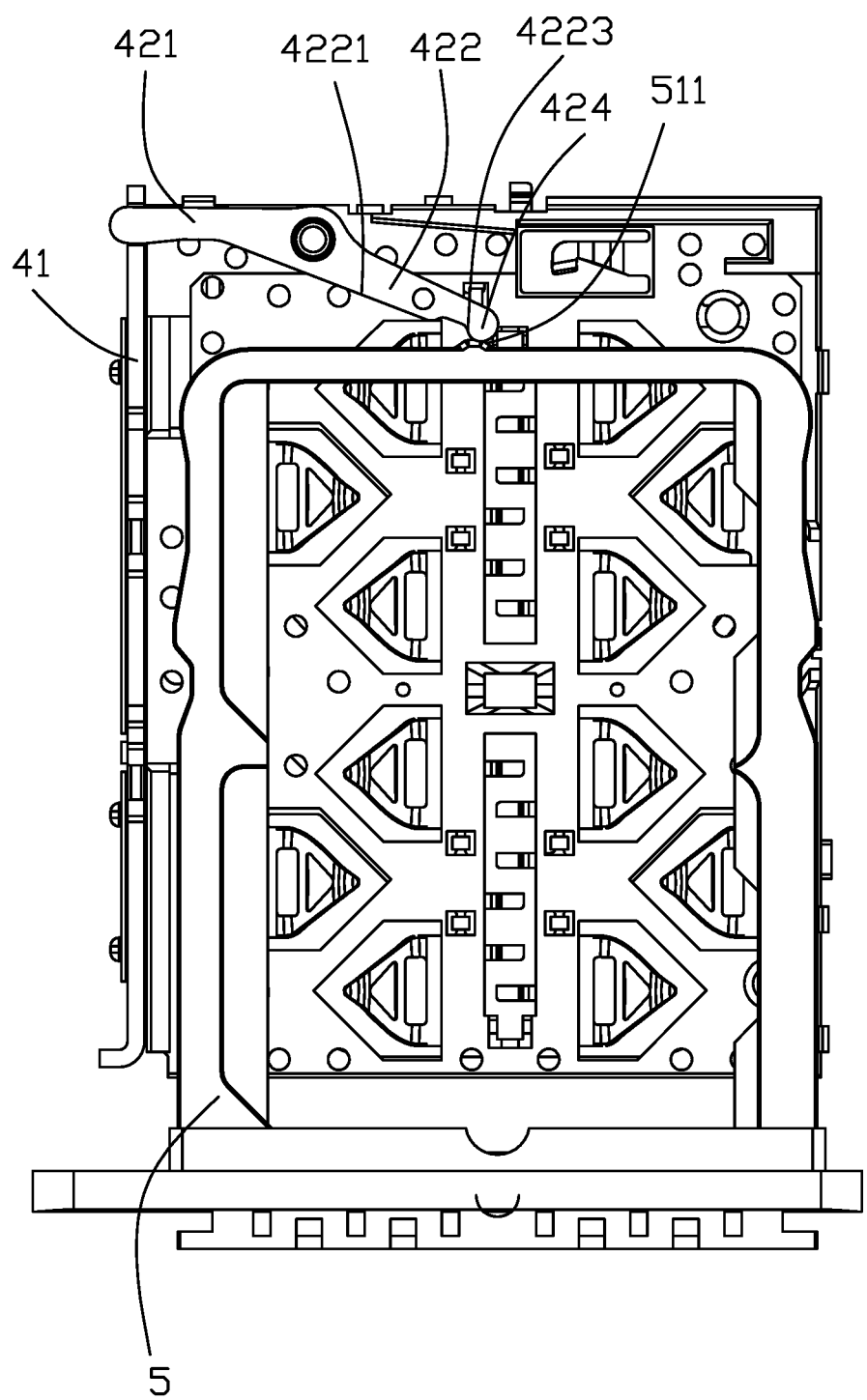
FIG. 6 is a plan view showing the card tray at a withdrawn position.

Referring to FIGS. 1 to 6, a card connector assembly comprises: an electrical connector 100 including an insulative housing 1, a plurality of terminals 2 secured to the insulative housing 1, and a shielding shell 3 covering the insulative housing 1 to form a receiving cavity 30; a card tray 5 removably received in the receiving cavity 30 between an inserted position (FIG. 5) and a withdrawn position (FIG. 6); and an ejector 4. The electrical connector may further include a metal frame 6 secured to the insulative housing 1 and engaged with the shell 3.

The terminals 2 are insert molded with the insulative housing 1 and each has a contacting portion 21. The ejector 4 includes an operating rod 41 and a pivot 42 coupled to the operating rod 41. The operating rod 41 and the pivot 42 are preferably metallic. The pivot 42 includes a coupling portion 421 and an engaging portion 422. The engaging portion 422 has an engaging surface 4221 for contacting a front surface 50 of the card tray 5 carrying electronic card or cards or even a front surface of an electronic card itself in the case of doing without a card tray. The operating rod 41 has a slot 411 for receiving the coupling portion 421. The metal frame 6 may be insert molded with the insulative housing 1. The insulative housing 1 has a post 111 and the pivot 42 has a hole 423 so that the pivot 42 is rotatably supported by the insulative housing 1. The metal frame 6 has a reinforcing member 61 positioned inside the post 111 for strengthening purpose.

In order to increase a withdrawn travel length of the card tray 5 for subsequent ease of removal or access, the engaging surface 4221 has a recess 4222 and the card tray 5 has a protrusion 51 at the front surface 50 to be received in the recess 4222. When the operating rod 41 is pushed to rotate the pivot 42, the card tray 5 is moved by the engaging portion 422 while the protrusion 51 leaves the recess 4222, and a free end 424 of the engaging portion 422 adjacent to the recess 4222 in turn engages or rides onto the protrusion 51. Presence of the protrusion 51 that the adjacent end of the engaging portion 422 rides onto results in an increased travel length of the card tray during ejecting. Preferably, the card tray 5 is metallic. The recess 4222 has a guiding surface 4223 at a junction with the free end 424; the protrusion 51 has a corresponding guiding surface 511. The guiding surface 4223 makes a smooth transition from the recess 4222 to the free end 424.

Figure 7:
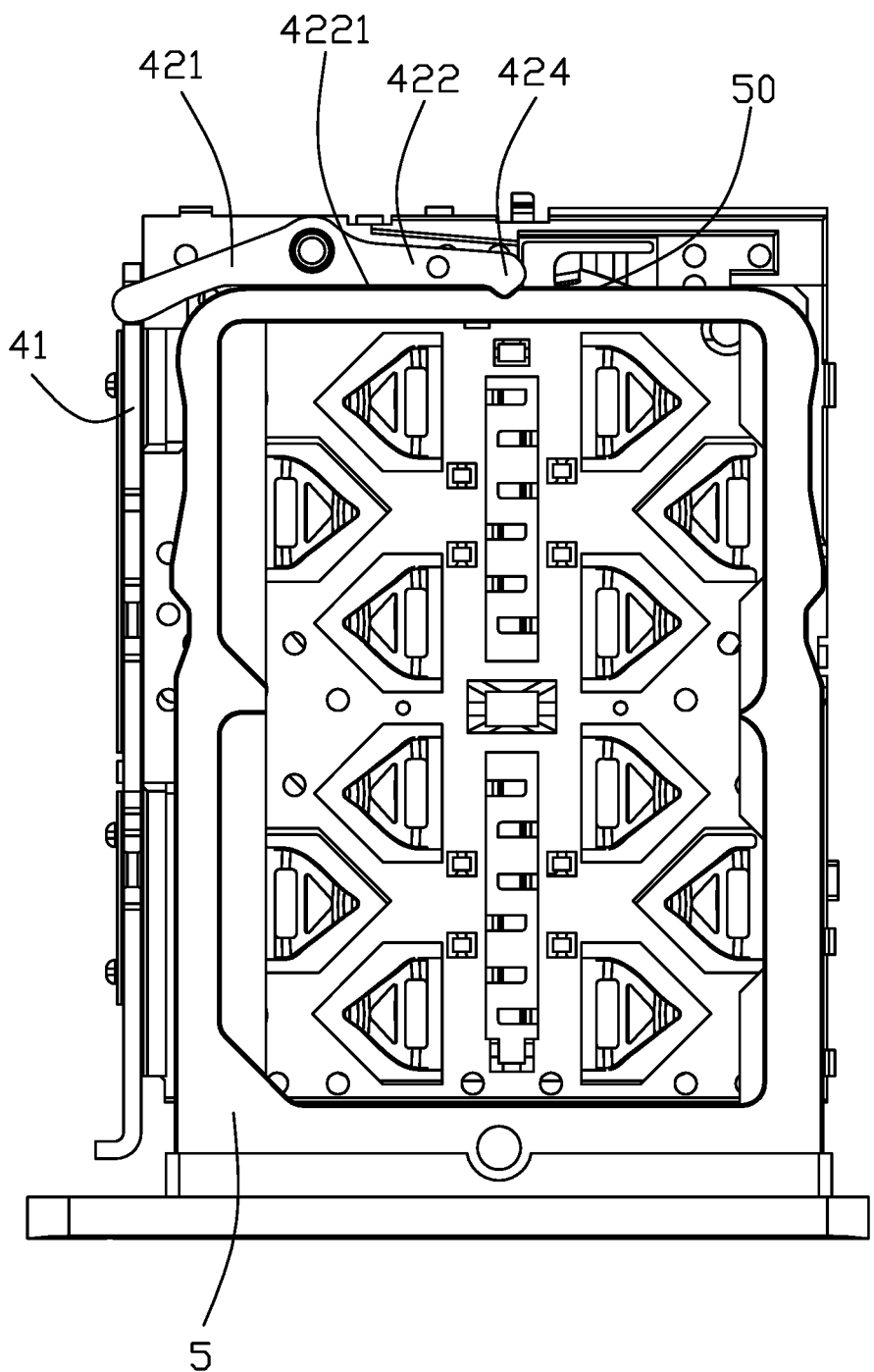
FIG. 7 is a plan view showing confrontation between the card tray and the pivot in the inserted position according to a second embodiment of the invention.

In one sense, a portion of the free end 424 protrudes relative to the recess 4222. In another sense, the protrusion 51 of the card tray 5 is positioned at a different level/position along the traveling direction from the front surface 50, as is a recess were it disposed to receive the protruding portion of the free end 424 of the engaging portion 422. For example, FIG. 7 essentially shows the recess (not labeled) formed in a front end region (not labeled) of the card tray 5 to receive the free end 424. In brief, the spirit of the invention is to have the free end 424 of the pivot 42 and a front end region of the card tray 5 are at least partially overlapped in the transverse direction perpendicular to the mating/inserting/ejecting/traveling direction so as to increase the traveling distance during ejection. In contrast, in the traditional design, the engaging free end of the pivot only intimately confronts the front end region of the card tray in the mating/inserting/ejecting/traveling direction without any overlapping in the transverse direction.

What is claimed is:

1. A card connector assembly comprising:
   an electrical connector including an insulative housing, a plurality of terminals secured to the insulative housing, a shell covering the insulative housing to form a receiving cavity, and an ejector having a pivot; and
   a card tray removably received in the receiving cavity between an inserted position and a withdrawn position, the card tray having a front surface; wherein the card tray has a protrusion at the front surface; and the pivot has an engaging portion for ejecting the card tray, the engaging portion having a recess receiving the protrusion when the card tray is at the inserted position and a free end riding onto the protrusion when the card tray is at the withdrawn position.

2. The card connector assembly as claimed in claim 1, wherein the card tray is metallic.

3. The card connector assembly as claimed in claim 1, wherein:

the insulative housing has a post supporting the pivot; and the electrical connector comprises a metal frame secured to the insulative housing and engaged with the shell, the metal frame having a reinforcing member positioned inside the post.

4. A card connector assembly comprising:

an electrical connector including an insulative housing, a plurality of terminals secured to the insulative housing, a shell covering the insulative housing to form a receiving cavity, and an ejector operable from an exterior and having a pivot having a free end; and a card tray removably received in the receiving cavity along an ejecting direction between an inserted position and a withdrawn position, the card tray having a front end region to intimately confront the free end of the pivot in said ejecting direction; wherein the free end of the pivot and the front end region of the card tray are at least partially overlapped with each other in a transverse direction perpendicular to the ejecting direction when the card tray is at the inserted position.

5. The card connector assembly as claimed in claim 4, wherein a protrusion is formed on a front face of the front end region of the card tray and overlapped with the free end of the pivot in the transverse direction.

6. The card connector assembly as claimed in claim 5, wherein the pivot forms a recess to receive said protrusion.

7. The card connector assembly as claimed in claim 4, wherein the front end region of the card tray forms a recess to receive the free end of the pivot.

\* \* \* \* \*